US011121291B2

United States Patent
Brick et al.

(10) Patent No.: US 11,121,291 B2
(45) Date of Patent: Sep. 14, 2021

(54) DISPLAY DEVICE

(71) Applicant: OSRAM Opto Semiconductors GmbH, Regensburg (DE)

(72) Inventors: Peter Brick, Regensburg (DE); Hubert Halbritter, Dietfurt (DE); Mikko Perälä, Tampere (FI)

(73) Assignee: OSRAM OLED GMBH, Regensburg (DE)

( * ) Notice: Subject to any disclaimer, the term of this patent is extended or adjusted under 35 U.S.C. 154(b) by 22 days.

(21) Appl. No.: 16/495,241

(22) PCT Filed: Mar. 19, 2018

(86) PCT No.: PCT/EP2018/056837
§ 371 (c)(1),
(2) Date: Sep. 18, 2019

(87) PCT Pub. No.: WO2018/172255
PCT Pub. Date: Sep. 27, 2018

(65) Prior Publication Data
US 2020/0091382 A1 Mar. 19, 2020

(30) Foreign Application Priority Data
Mar. 21, 2017 (DE) .......................... 102017106033.2

(51) Int. Cl.
*H01L 33/50* (2010.01)
*H01L 33/58* (2010.01)
(Continued)

(52) U.S. Cl.
CPC .............. *H01L 33/507* (2013.01); *G09F 9/33* (2013.01); *H01L 25/0753* (2013.01);
(Continued)

(58) Field of Classification Search
None
See application file for complete search history.

(56) References Cited

U.S. PATENT DOCUMENTS

| 5,371,434 A | 12/1994 | Rawlings |
| 2004/0070333 A1 | 4/2004 | Lin et al. |

(Continued)

FOREIGN PATENT DOCUMENTS

WO 2014173736 A1 10/2014

OTHER PUBLICATIONS

Powell, R.C., "Physics of Solid-State Laser Materials," Atomic, Molecular, and Optical Physics, Springer, ISBN 1-56396-658-1, 1998, 35 pages.

(Continued)

*Primary Examiner* — Robert K Carpenter
(74) *Attorney, Agent, or Firm* — Slater Matsil, LLP

(57) ABSTRACT

A display device is disclosed. In an embodiment a device includes at least one optoelectronic semiconductor component configured to generate primary radiation, a plurality of pixels, wherein each pixel includes at least a first subpixel configured to generate radiation in a first spectral range and a second subpixel configured to generate radiation in a second spectral range different from the first spectral range, wherein the first and second subpixels are each assigned an active region of the semiconductor component; and a radiation conversion element arranged downstream of at least some of the active regions, wherein the radiation conversion element configured to at least partially convert the primary radiation into a secondary radiation and to radiate the secondary radiation at a narrow angle.

20 Claims, 5 Drawing Sheets

(51) Int. Cl.
  *H01L 25/075* (2006.01)
  *H01L 25/16* (2006.01)
  *G09F 9/33* (2006.01)

(52) U.S. Cl.
  CPC .......... *H01L 25/167* (2013.01); *H01L 33/504* (2013.01); *H01L 33/58* (2013.01)

(56) References Cited

U.S. PATENT DOCUMENTS

| | | |
|---|---|---|
| 2016/0050409 A1 | 2/2016 | Park et al. |
| 2016/0076731 A1 | 3/2016 | Mönch et al. |
| 2020/0091382 A1* | 3/2020 | Brick .................. H01L 25/0753 |

OTHER PUBLICATIONS

Rosemann, N.W. et al., "A Highly Efficient Directional Molecular White-Light Emitter Driven by a Continuous-Wave Laser Diode," Optical Materials, vol. 352, Issue 6291, Jun. 10, 2016, 28 pages.

\* cited by examiner

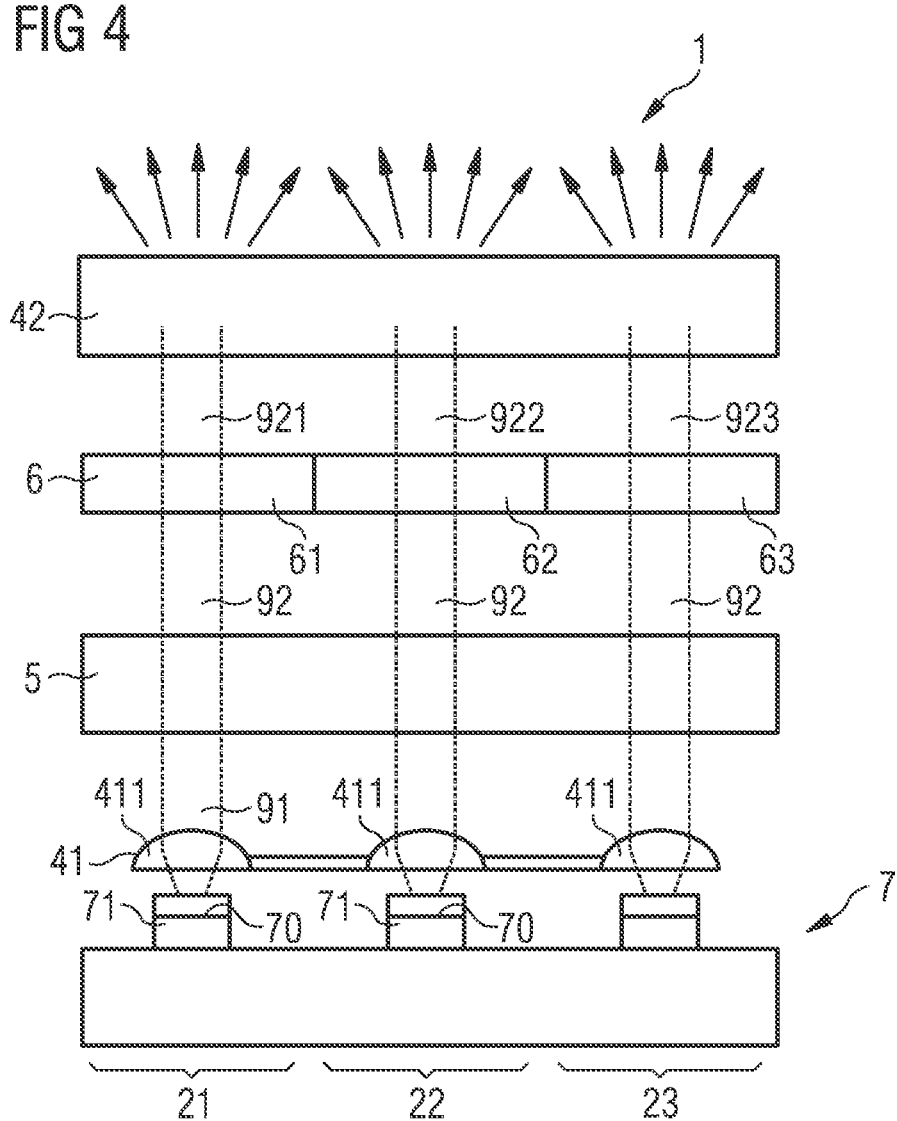

DISPLAY DEVICE

This patent application is a national phase filing under section 371 of PCT/EP2018/056837, filed Mar. 19, 2018, which claims the priority of German patent application 102017106033.2, filed Mar. 21, 2017, each of which is incorporated herein by reference in its entirety.

TECHNICAL FIELD

The present application relates to a display device, in particular for 3D representation.

BACKGROUND

Approaches for the realization of display devices, in particular for 3D representation, typically have a complex design. This applies in particular to the optical system which creates a three-dimensional effect.

SUMMARY OF THE INVENTION

Embodiments provide a display device which has a simple design and a wide range of applications.

A display device is specified. The display device is intended in particular for displaying moving or still images. The display device comprises a plurality of pixels and at least one optoelectronic semiconductor component.

According to at least one embodiment of the display device, each pixel comprises at least a first subpixel for generating radiation in a first spectral range and a second subpixel for generating radiation in a second spectral range different from the first spectral range. For example, each pixel comprises a triple of subpixels that emit radiation in the red, green and blue spectral ranges.

According to at least one embodiment of the display device, the subpixels are each assigned an active region of the semiconductor component provided for generating primary radiation. In particular, each subpixel is assigned at least one active region, which can be controlled independently of the other active regions. For example, in the display device or outside the display device, a control circuit is provided which is configured to control the individual subpixels.

For example, the active regions of the first subpixels and the second subpixels emit the same or substantially the same primary radiation. This means that, apart from production-related fluctuations, a spectral radiation of the radiation emitted by the active regions of the first subpixels and second subpixels is the same. For example, the active regions of the first subpixels and the active regions of the second subpixels are based on the same semiconductor material. This typically results in the same operating voltages. This simplifies electrical control by means of a common control circuit.

According to at least one embodiment of the display device, a radiation conversion element is arranged downstream of at least some of the active regions, wherein the radiation conversion element at least partially converts the primary radiation into a secondary radiation during operation of the display device. For example, each pixel has a radiation conversion element for at least one subpixel. In particular, the radiation emitted by the radiation conversion element is incoherent or at most partially coherent. In particular, the radiation conversion element is not located in a resonator.

According to at least one embodiment of the display device, the radiation conversion element radiates the secondary radiation at a narrow angle. This means that the radiation conversion element itself, i.e., already without an optical element arranged downstream of the same, radiates at a narrow angle, in particular due to the physical process underlying the radiation conversion. For example, the radiation conversion element is given a directionality of the incident primary radiation at least partly. In other words, a directed incident primary radiation causes an at least partially directed radiation of secondary radiation due to the physical process underlying the radiation conversion.

A narrow-angled radiation is a radiation that radiates into a smaller projected spatial angle than a Lambertian surface radiator. A Lambertian surface radiator radiates into a half-space, so that the projected spatial angle is $\pi$. For example, the radiation conversion element radiates into a projected spatial angle of at most $\pi/2$.

It has been shown that a radiation conversion element is particularly suitable where the primary radiation causes, in the conversion element, a radiation conversion into secondary radiation based on a non-linear optical process.

A non-linear optical process is generally understood to be a process in which the incident electric field of the primary radiation causes, in the radiation conversion element, a polarization that is no longer purely linear to the electric field.

For example, materials whose electronic ground state has an anharmonic potential are suitable. Driven by an electric field, higher harmonics can be generated. For example, the article by N. W. Rosemann in Science, Vol. 352, Iss. 6291, 1301-1304 (2016) describes a highly efficient molecular white light emitter. The entire disclosure content of this article is hereby explicitly included in the present application by reference.

Alternatively or in addition, a non-linear optical process can be used which leads to an up-conversion of the exciting primary radiation. Such processes include, for example, two-photon absorption, cross-relaxation energy transfer or avalanche absorption. A two-photon absorption includes in particular an absorption via a virtual intermediate state, an absorption via a resonant intermediate state or an absorption via a non-resonant intermediate state.

Such non-linear optical processes are described in connection with materials for solid-state lasers in the book "Physics of solid-state laser materials" by R. C. Powell, ISBN 1-56396-658-1. In this regard, the entire disclosure content is hereby explicitly included in the present application by reference. It has been shown that such processes are also suitable for a display device, even if, unlike lasers, a display device does not aim at a radiation that is as purely coherent as possible.

After up-conversion, the radiation conversion element can emit secondary radiation of a wavelength shorter than the excitation radiation (primary radiation) by spontaneous or stimulated emission.

In this way, a display device can be realized in which the secondary radiation is generated with a low etendue. Due to the low etendue, the radiation emitted by the radiation conversion element can be further processed in a simplified way. For example, highly efficient illumination of a field of view of the display device can be achieved with a particularly compact design. In addition, this results in improved cost efficiency, since highly efficient illumination of the field of view can be achieved with smaller light sources and optical elements.

In at least one embodiment of the display device, the display device comprises a plurality of pixels and at least one optoelectronic semiconductor component. Each pixel comprises at least a first subpixel for generating radiation in a first spectral range and a second subpixel for generating radiation in a second spectral range different from the first spectral range. Each subpixel is assigned an active region of the semiconductor component that is provided for generating primary radiation. A radiation conversion element is arranged downstream of at least some of the active regions, wherein the radiation conversion element at least partially converts the primary radiation into a secondary radiation during operation of the display device and the radiation conversion element radiates the secondary radiation at a narrow angle.

According to at least one embodiment of the display device, each pixel comprises at least two additional subpixels, the subpixels radiating the radiation during operation of the display device along a first radiation direction and the additional subpixels radiating the radiation along a second radiation direction. The first radiation direction and the second radiation direction are different from each other and extend, for example, obliquely to one another. For example, each pixel provides a color triple that radiates along the first radiation direction and another color triple that radiates along the second radiation direction. In this way, the representation of three-dimensional images can be achieved. Special glasses or other aids are not required to achieve the three-dimensional effect when viewing the images. The term "images" encompasses both moving and still images.

According to at least one embodiment of the display device, the active regions emit coherent or partially coherent primary radiation during operation of the display device, especially in the infrared spectral range. For example, the active region is in each case part of a semiconductor laser, such as a surface emitting semiconductor laser or a resonant cavity light emitting diode (RCLED). These semiconductor components are characterized by a high efficiency, so that, in particular in combination with the narrow-angled radiating conversion element, for the subpixels a highly efficient radiation source is produced, which radiates the desired radiation more directionally than a Lambertian surface radiator. Surface-emitting lasers can also be used to achieve particularly high beam quality. In addition, a matrix-shaped two-dimensional arrangement of active regions is simplified by means of a surface-emitting laser and can be achieved in a particularly compact way.

According to at least one embodiment of the display device, the active regions emit primary radiation in the infrared spectral range. The active regions are provided for generating radiation in the infrared spectral range, for example, with a peak wavelength between 780 nm and 980 nm.

According to at least one embodiment of the display device, the radiation conversion element radiates secondary radiation comprising radiation in the first and second spectral ranges. The radiation conversion element thus radiates spectrally broadband, for example, with a full half-width of the secondary radiation of at least 100 nm, for example, at least 200 nm. For example, the radiation emitted by the radiation conversion element appears white to the human eye. For example, the radiation conversion element is a radiation conversion element of uniform design in the lateral direction. This means that the peak wavelength of the secondary radiation is independent of the lateral position at which the primary radiation impinges on the radiation conversion element. For example, the laterally uniform radiation conversion element covers both a first subpixel and a second subpixel.

In particular, a filter element is arranged downstream of the radiation conversion element in the radiation direction, said filter element transmitting radiation in the first spectral range for the first subpixel and radiation in the second spectral range for the second subpixel. In other words, the radiation emitted by the first subpixel and the second subpixel is obtained from the same secondary radiation by means of downstream filtering.

According to at least one embodiment of the display device, the radiation conversion element has the same spectral radiation characteristic above the first subpixel and above the second subpixel. This means that the radiation conversion element is not subdivided into individual segments that are assigned to the respective subpixels. For example, the radiation conversion element extends continuously over the first subpixel and the second subpixel.

According to at least one embodiment of the display device, the radiation conversion element comprises a plurality of segments, wherein first segments emit secondary radiation in the first spectral range and second segments emit secondary radiation in the second spectral range. The radiation emitted by the subpixels is thus generated via different segments of the radiation conversion element. There is no need for a filter element downstream of the radiation conversion element to generate different spectral emission ranges. However, such a filter element may be additionally provided, for example, if the secondary radiation generated by the respective segment is spectrally wider than is intended for the corresponding subpixels of the display device.

According to at least one embodiment of the display device, the radiation conversion element radiates the secondary radiation into a projected spatial angle of at most $\pi/5$. The radiation emitted by the radiation conversion element is thus narrow-angled to an increased degree and is characterized by simplified further processing, for example, by means of an optical element arranged downstream in the beam path.

According to at least one embodiment of the display device, a first optical element is arranged between the active regions and the radiation conversion element. The first optical element is configured in particular to focus the primary radiation emitted by the individual active regions into the material of the radiation conversion element and in particular to collimate it. For example, the primary radiation impinges on the radiation conversion element at least approximately as a parallel beam. A narrow-angled radiation of the conversion element is thus promoted. Furthermore, higher local power densities can be achieved in the material of the radiation conversion element compared to diverging primary radiation. This increases the efficiency of non-linear optical processes.

According to at least one embodiment of the display device, the display device comprises a second optical element, the radiation conversion element being arranged in the beam path between the active region and the second optical element. The second optical element is intended in particular to define the field of view of the display device.

The terms first optical element and second optical element merely serve for a simplified differentiation of these elements. The term second optical element, however, does not imply that a first optical element necessarily exists. Rather, the second optical element may also be the only optical element of the display device. Accordingly, the first optical element may also be the only optical element of the display device.

In particular, the first optical element and/or the second optical element may comprise or consist of a diffractive optical element, a refractive optical element or a reflective optical element.

According to at least one embodiment of the display device, the second optical element is a diffractive optical element. Particularly low overall heights can be achieved with a diffractive optical element. Furthermore, a diffractive element is particularly suitable for directing the radiation emitted by the subpixels and the additional subpixels in the first or second radiation direction. A 3D representation can thus be achieved in a simplified manner. Particularly in combination with the narrow-angled radiation of the radiation conversion element, the display device offers a particularly compact and cost-effective display device for the 3D representation of images.

According to at least one embodiment of the display device, at least two of the active regions are integrated in a semiconductor chip of the semiconductor component. For example, at least all active regions for a pixel are integrated in a semiconductor component, such as a semiconductor chip. For example, in the manufacture of the semiconductor chip the active regions result from the same semiconductor layer sequence. This means that the active regions do not differ with regard to their material composition and their layer thicknesses or only within the limits of production-related fluctuations in the lateral direction during epitaxial deposition, for example. A particularly compact design of the display device and small distances between adjacent subpixels can thus be achieved in a simplified manner.

According to at least one embodiment of the display device, the semiconductor component comprises a plurality of surface emitting semiconductor regions each forming an active region. For example, the active regions are arranged next to each other in a matrix. In particular, the active regions can be part of a vertical cavity surface emitting laser (VCSEL). The cavity thus extends perpendicularly to a main extension plane of the respective active region.

According to at least one embodiment of the display device, an additional redundant active region is assigned to at least one subpixel. In particular, each subpixel is assigned an additional redundant active region. The redundant active region is configured to fully or at least partially compensate for a failure of an active region in the event of a failure. For example, the active region and the assigned redundant active region are electrically connected in parallel. Alternatively or additionally, identification and deactivation of failed active regions may be carried out during manufacture or operation of the display device. A failure of an active region can therefore be compensated by the assigned redundant active region and does not necessarily require the rejection of the entire display device during manufacture or the replacement of the entire display device during operation.

According to at least one embodiment of the display device, each pixel comprises at least two additional subpixels, wherein the display device has a second optical element, and wherein the radiation conversion element is arranged in the beam path between the active region and the second optical element. The second optical element directs radiation of the first and second subpixels in a first radiation direction and radiation of the two additional subpixels in a second radiation direction different from the first radiation direction. A 3D representation of an image can thus be realized in a particularly simple and compact way.

BRIEF DESCRIPTION OF THE DRAWINGS

Further embodiments and functionalities can be deduced from the following description of the exemplary embodiments in connection with the figures.

In the figures:

FIGS. 4 and 5 each show an exemplary embodiment of a display device in a schematic sectional view.

Identical, similar or equivalent elements are provided with the same reference signs in the figures.

The figures are schematic representations and therefore not necessarily true to scale. Rather, comparatively small elements and, in particular, layer thicknesses can be displayed exaggeratedly large for clarification.

The figures each show exemplary embodiments of a display device, where only a section of the display device comprising one pixel is shown for simplified representation. The display device comprises a plurality of such pixels, which, for example, are arranged next to each other in a two-dimensional arrangement, such as a matrix. The number of pixels can be varied within wide limits and can be at least 100, at least 10,000 or at least 1,000,000.

DETAILED DESCRIPTION OF ILLUSTRATIVE EMBODIMENTS

Figure 1A:
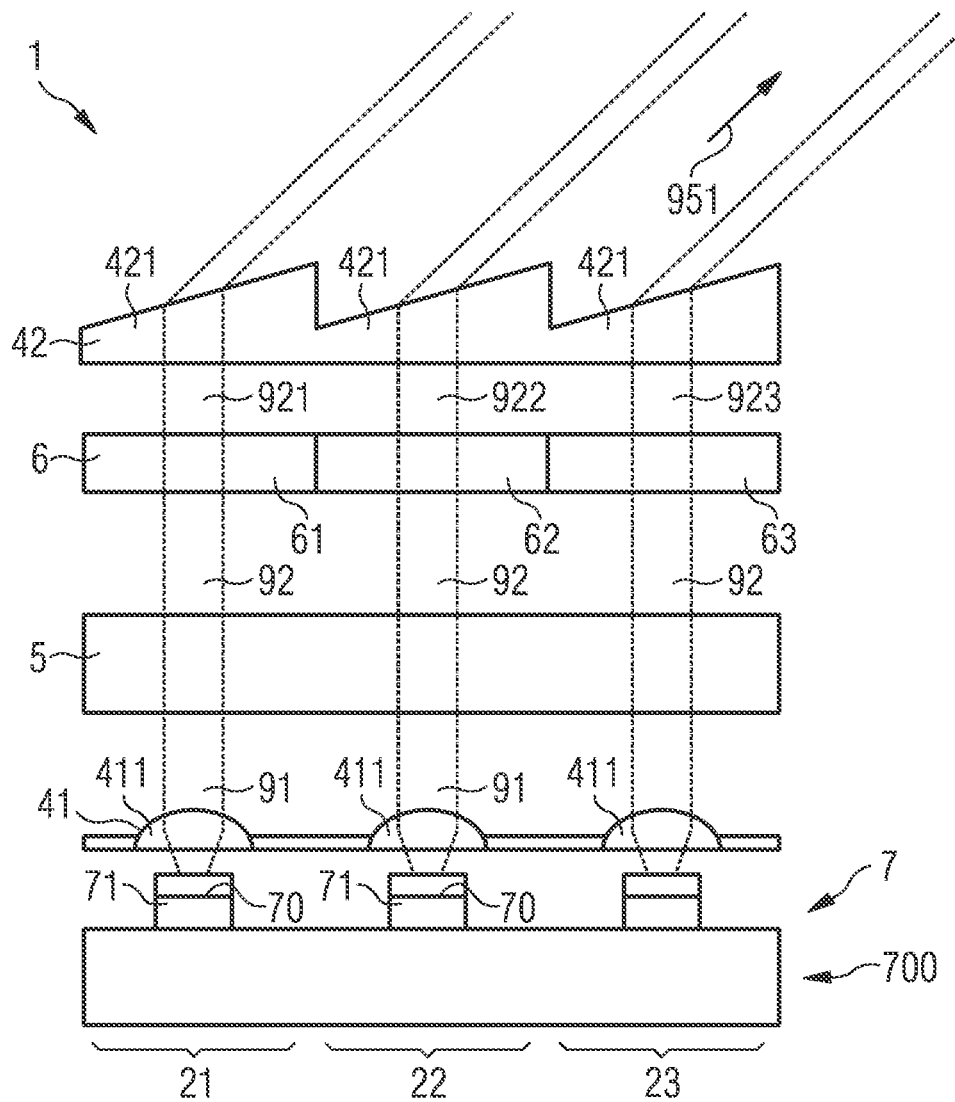
FIG. 1A shows an exemplary embodiment of a display device in a schematic sectional view.
Figure 1B:
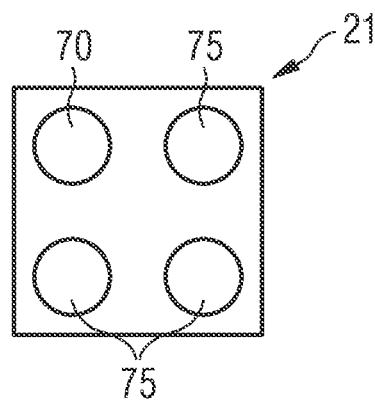
FIG. 1B shows an exemplary embodiment of a display device in a plan view.

In the exemplary embodiment shown in FIGS. 1A and 1B, the pixel 1 comprises a first subpixel 21 for generating radiation in a first spectral range 921, a second subpixel 22 for generating radiation in a second spectral range 922, and a third subpixel 23 for generating radiation in a third spectral range 923. The spectral ranges are different from each other in pairs. For example, each pixel forms a color triple with radiation in the red, green and blue spectral ranges. However, a pixel may also comprise more or less than three subpixels. For example, each pixel comprises an additional subpixel for generating radiation in the infrared spectral range and/or radiation in the yellow spectral range.

The first subpixel 21, the second subpixel 22 and the third subpixel 23 each are assigned an active region 70 of a semiconductor component 7 of the display device provided for generating primary radiation 91. The semiconductor component 7, for example, has a semiconductor chip 700 forming one or more active regions 70.

A radiation conversion element 5 is arranged downstream of the active regions 70, in particular a common radiation conversion element for all subpixels of a pixel 1 or for two or more pixels 1 of the display device. For example, the radiation conversion element is configured to convert at least part of the primary radiation 91 generated by the active regions 70 into a secondary radiation 92. The radiation conversion element radiates the secondary radiation in particular at a narrow angle, for example, with a projected spatial angle of at most $\pi/2$, preferably into a projected spatial angle of at most $\pi/5$.

As a material for the radiation conversion element 5, a material is particularly suitable in which the primary radiation causes, in the radiation conversion element, a radiation conversion based on a non-linear optical process.

For example, the radiation conversion material comprises semiconductor-based cluster molecules that are provided with covalently bonded organic ligands. These organic ligands can provide delocalized electron states.

For example, the molecules are based on tin sulfide with a diamond-like structure (diamondoids). Due to their tetrahedral structure, these have no inversion symmetry. For example, the organic ligands R have the structure $R=4-(CH_2=CH)-C_6H_4$.

For example, this material exhibits a broad emission spectrum in the visible spectral range when excited at a wavelength of 980 nm. In an excitation wavelength range from 725 nm to 1050 nm, the spectral distribution of the white light produced is largely the same.

In principle, however, all materials are suitable in which non-linear optical processes, in particular the processes mentioned in the general part of the description, such as up-conversion, occur with a sufficiently high efficiency.

A filter element 6 is arranged downstream of the radiation conversion element 5 in the radiation direction. The first, second and third subpixels 21, 22, 23 are each assigned a first filter region 61, a second filter region 62 and a third filter region 63, respectively, of the filter element. The filter regions each transmit radiation in different spectral ranges of the secondary radiation 92 generated by the radiation conversion element 5. For example, the first filter region 61 transmits radiation in the first spectral range 921, for example, in the red spectral range, the second filter region 62 transmits radiation in the second spectral range 922, for example, radiation in the green spectral range, and the third filter region 63 transmits radiation in the third spectral range 923, for example, radiation in the blue spectral range. In particular, the filter element 6 can also block the primary radiation 91 if a radiation exit of the primary radiation is not desired.

The radiation conversion element thus radiates secondary radiation 92 which comprises radiation in the first spectral range 921, radiation in the second spectral range 922 and radiation in the third spectral range 923.

In other words, the secondary radiation is spectrally so wide that it contains radiation components in the various spectral ranges to be radiated by the subpixels. For example, a full half-width of the secondary radiation is at least 100 nm, at least 200 nm or at least 300 nm.

The radiation conversion element has the same spectral radiation characteristic over the individual subpixels. The radiation conversion element is therefore uniform in its spectral radiation characteristics. For example, the radiation conversion element 5 extends continuously over the subpixels 21, 22, 23 of a pixel 1 or over the subpixels of several or all pixels 1.

The active regions 70 emit coherent or partially coherent primary radiation 91 during operation of the display device, especially in the infrared spectral range. For example, the peak wavelength of the primary radiation 91 lies between 780 nm and 980 nm inclusive.

A first optical element 41 is optionally arranged between the active regions 70 and the radiation conversion element 5. For example, the optical element may be a contiguous optical element that extends over one or more subpixels of a pixel, over several pixels, or over all pixels of the display device. This simplifies the manufacture of the display device.

For example, an optical segment 411 of the first optical element 41 is assigned to each pixel 1 or subpixel of a pixel. In this exemplary embodiment, the optical segments 411 of the first optical element are only exemplarily designed as plano-convex lenses. Alternatively, a different design may be used, for example, a different refractive design or a design of the first optical element 41 in the form of a diffractive optical element. Of course, the individual optical segments 411 can also be discrete optical elements that are spaced apart from each other.

The first optical element 41 is intended in particular to focus the primary radiation emitted by the active regions 70 and thereby increase the local power density in the radiation conversion element 5. The efficiency of radiation conversion in the radiation conversion element 5 can thus be increased.

A second optical element 42 is arranged on the side of the radiation conversion element 5 facing away from the semiconductor component 7. In the exemplary embodiment shown, the second optical element 42 comprises a plurality of optical segments 421, each subpixel being assigned one optical segment. In a sectional view, the optical segment 421 of the second optical element 42 is in each case exemplarily designed in the form of a prism so that the radiation emitted by the individual subpixels 21, 22, 23 is radiated along a first radiation direction 951. However, the second optical element may also be designed differently, for example, as a different refractive element where refraction occurs at one or more interfaces, such as a lens or a stepped lens, or as a diffractive optical element. By means of a diffractive optical element, radiation components can easily and compactly be directed in different radiation directions and/or shaped in accordance with a desired field of view, in particular in connection with the narrow-angled radiating radiation conversion element 5. In the case of a refractive optical element, a structure size for the optical segments in the lateral direction is, in the example shown, the lateral extent of a prism, for example, at least 10 μm. In the case of a diffractive optical element, for example, a structure size for the optical segments is between and including 0.3 μm and including 3 μm.

By providing additional subpixels that radiate along a second radiation direction different from the first radiation direction, 3D representation of a moving or still image can be achieved. This is explained in more detail in connection with FIGS. 2A and 2B. Deviating from this, however, the display device can also be designed as a conventional 2D display device. In this case, the second optical element 42 is intended to define the field of view of the display device.

More than one active region 70 can be assigned to each subpixel. This is shown in FIG. 1B as an example for the first subpixel 21 in a top view of the display device. In addition to the active region 70, three additional redundant active regions 75 are assigned to the first subpixel 21. For example, the active region and the assigned redundant active regions are electrically connected in parallel and can be controlled jointly via a control circuit. If the active region 70 fails, the redundant active regions can continue to emit radiation so that the failure of an active region does not necessarily result in the complete failure of a subpixel.

This enables particularly low failure rates to be achieved during production. Furthermore, the service life of the display device can be increased during operation. Redundant active regions can also be used in the following exemplary embodiments, even if they are not explicitly shown for a simplified representation.

The active regions 70 and, where applicable, the redundant active regions 75 of a subpixel, the active regions of several subpixels of a pixel, or the active regions of several or all of the pixels of the display device may be integrated in a common semiconductor chip of the semiconductor component 7. For example, the semiconductor component 7 comprises a plurality of surface emitting semiconductor regions 71, each forming an active region. For example, each active region 70 is part of a vertical cavity surface emitting laser.

The active regions 70 of the individual subpixels 21, 22, 23 can each be based on the same semiconductor material. For example, an active region based on an arsenide compound semiconductor material is suitable for the generation of radiation in the infrared spectral range.

"Based on an arsenide compound semiconductor material" in the present context means that the active region or at least part thereof comprises or consists of an arsenide compound semiconductor material, preferably $Al_xIn_yGa_{1-x-y}As$, where $0 \leq x \leq 1$, $0 \leq y \leq 1$ and $x+y \leq 1$. This material does not necessarily have to have a mathematically exact composition according to the above formula. Rather, it may, for example, contain one or more dopants and additional components. For simplicity's sake, however, the above formula contains only the essential components of the crystal lattice (Al, Ga, In, As), even if these may be partially replaced and/or supplemented by small amounts of other substances.

Figure 2A:
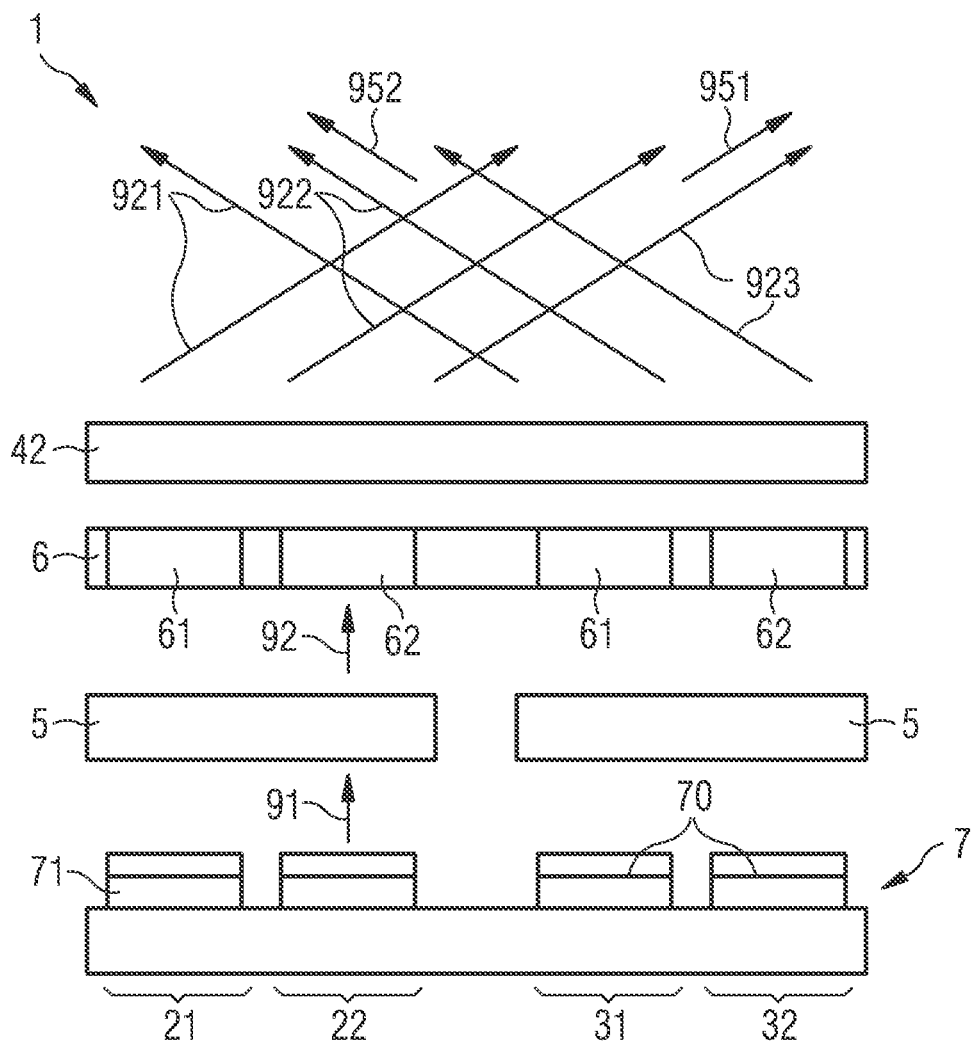
FIG. 2A shows an exemplary embodiment of a display device in a schematic sectional view.
Figure 2B:
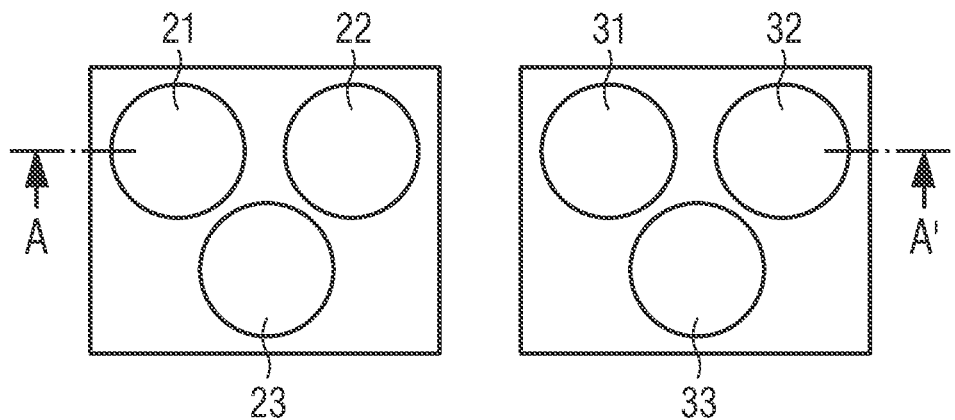
FIG. 2B shows an exemplary embodiment of a display device in a plan view.

The active regions 70 of different subpixels can therefore be operated with the same forward voltage, for example, by means of a control circuit integrated in the display device or arranged outside the display device and electrically connected to the active regions. In contrast to this, different forward voltages are required if the radiation emitted by the individual subpixels in different spectral ranges is generated directly as primary radiation in the active region and the material of the active regions must be adapted accordingly to the radiation to be generated. Furthermore, the control voltages required for semiconductor components emitting in the infrared spectral range are lower than for semiconductor components emitting radiation in the blue spectral range, for example.

the exemplary embodiment shown in FIGS. 2A and 2B essentially corresponds to the exemplary embodiment described in connection with FIGS. 1A and 1B, FIG. 2A representing a sectional view along the line AA' shown in FIG. 2B. In the top view of FIG. 2B, only the geometric arrangement of the subpixels is shown for simplified representation.

In addition to subpixels 21, 22, 23, each pixel 1 comprises a plurality of additional subpixels 31, 32, 33. The additional subpixels 31, 32, 33 each emit in a second radiation direction 952 which is oblique to the first radiation direction 951. With regard to the spectral radiation characteristic, a first additional subpixel 31 corresponds to the first subpixel 21, a second additional subpixel 32 to the second subpixel 22 and a third additional subpixel 33 to the third subpixel 23.

Each pixel thus provides a subpixel and an additional subpixel for three different spectral components, for example, radiation in the red, green and blue spectral ranges, which emit in different radiation directions. 3D representation of images can thus be achieved without the viewer needing further aids, such as special glasses.

Figure 3A:
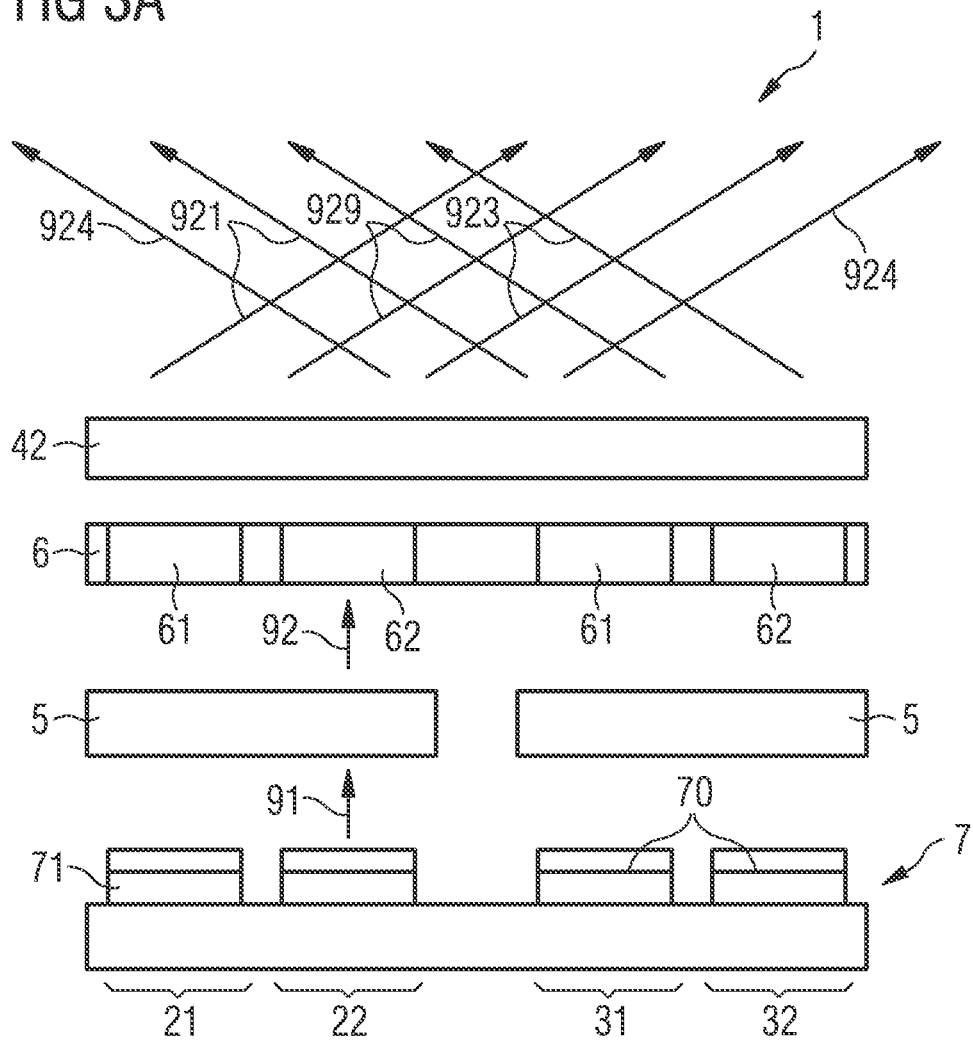
FIG. 3A shows an exemplary embodiment of a display device in a schematic sectional view.
Figure 3B:
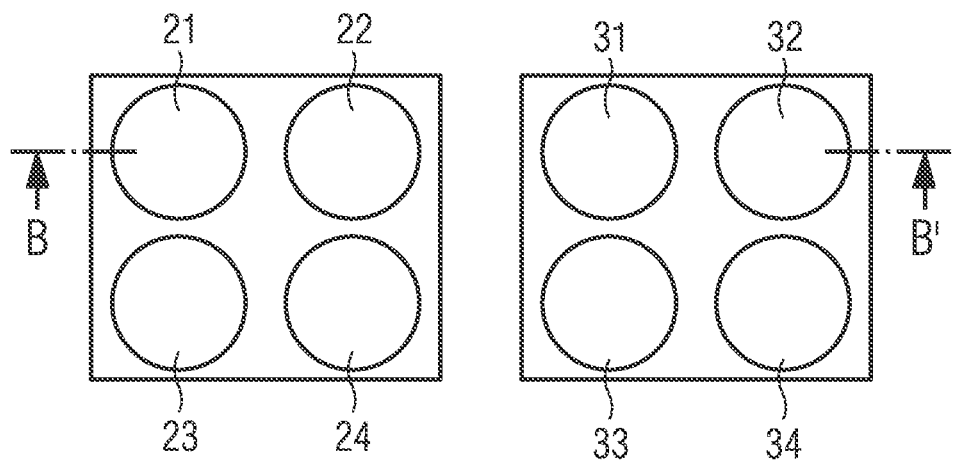
FIG. 3B shows an exemplary embodiment of a display device in a plan view.

The exemplary embodiment shown in FIGS. 3A and 3B essentially corresponds to the exemplary embodiment described in connection with FIGS. 2A and 2B.

In contrast to this, the pixel 1 also comprises a fourth subpixel 24 and a fourth additional subpixel 34. The fourth subpixel 24 and the fourth additional subpixel 34 are each provided for generating radiation in a fourth spectral range which is different from the first, second and third spectral ranges. For example, the fourth spectral range lies in the visible spectral range, such as the yellow spectral range.

By increasing the number of radiation components, a particularly large color space can be covered in the CIE color diagram.

Alternatively, the fourth spectral range can also lie in the infrared spectral range. In this case, the primary radiation emitted by the associated active region 70 can also exit directly from the display device, i.e., without radiation conversion in the radiation conversion element 5. Hence, the radiation component in the fourth spectral range 924 is part of the primary radiation 91. Infrared radiation, for example, is particularly suitable for sensor technology applications or for night vision applications.

The exemplary embodiment shown in FIG. 4 essentially corresponds to the exemplary embodiment described in connection with FIGS. 1A and 1B. In contrast to this, the display device is not designed as a 3D display device, but as a 2D display device. The second optical element 42 is therefore not used to deflect the beam in different radiation directions, but in particular to define the field of view of the display device. The described radiation generation by means of a narrow-angled radiating radiation conversion element 5 is also particularly suitable for such 2D display devices, since, for example, the downstream beam shaping by means of the second optical element 42 is simplified and the active regions 70 of different subpixels 21, 22, 23 can be based on the same semiconductor material and can thus be operated with the same forward voltage.

Figure 5:
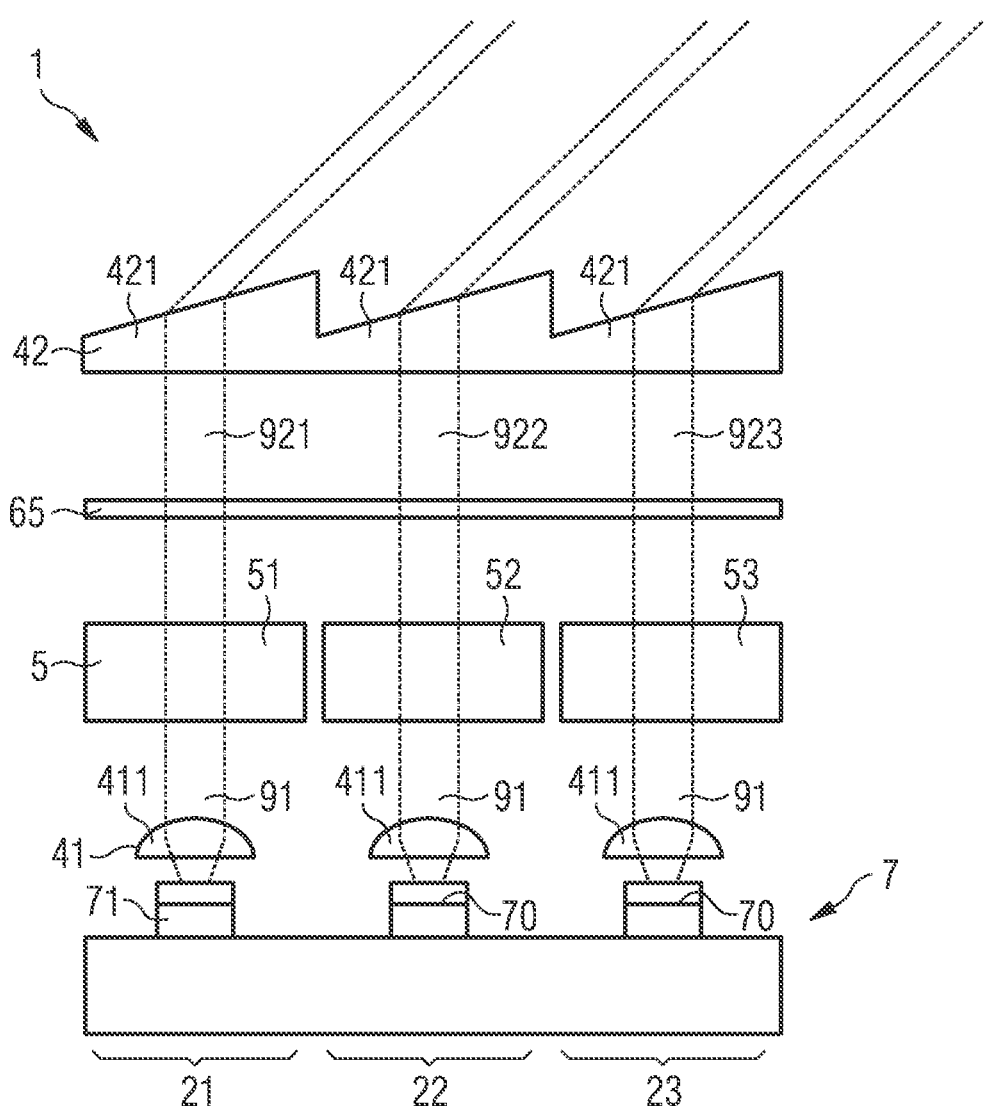

The exemplary embodiment shown in FIG. 5 essentially corresponds to the exemplary embodiment described in connection with FIGS. 1A and 1B.

In contrast to this, the radiation conversion element 5 comprises mutually different segments. The segments are each designed to generate secondary radiation in different spectral ranges. By means of the different segments, the radiation conversion materials for the individual segments can, for example, be selected independently of each other for efficient radiation conversion in radiation to be emitted from the respective subpixel. The first subpixel 21 is assigned a first segment 51, the second subpixel 22 a second segment 52 and the third subpixel 23 a third segment 53. There is no need for a filter element downstream of the radiation conversion element 5 to generate radiation with different spectral components. However, such a filter element can be optionally provided, for example, to reduce the spectral width of the secondary radiation emitted by the segments 51, 52, 53. Alternatively or additionally, a further filter element 65 can be arranged downstream of the radiation conversion element 5 in the radiation direction, said further filter element blocking the primary radiation 91 in the infrared spectral range for at least one or also for all subpixels.

Especially due to the narrow-angled radiation of the radiation conversion element and the resulting low etendue, efficient beam shaping or beam deflection in different radiation directions can be achieved with a simple design of the second optical element. The display device described is therefore characterized, among other things, by a particularly compact design and low manufacturing costs.

The invention is not limited by the description of the exemplary embodiments. Rather, the invention includes any new feature and any combination of features, which in particular includes any combination of features in the patent claims, even if that feature or combination itself is not explicitly mentioned in the patent claims or the exemplary embodiments.

The invention claimed is:

1. A display device comprising:
   at least one optoelectronic semiconductor component configured to generate primary radiation;
   a plurality of pixels, each pixel comprising:
      at least a first subpixel configured to generate radiation in a first spectral range; and
      a second subpixel configured to generate radiation in a second spectral range different from the first spectral range,
      wherein the first and second subpixels are each assigned an active region of the semiconductor component; and
   a radiation conversion element arranged downstream of at least some of the active regions,
   the radiation conversion element configured to:
      at least partially convert the primary radiation into secondary radiation; and
      radiate the secondary radiation at a narrow angle,
   wherein each pixel comprises at least two additional subpixels, and
   wherein the subpixels are configured to radiate the radiation along a first radiation direction and the additional subpixels are configured to radiate the radiation along a second radiation direction extending obliquely to the first radiation direction.

2. The display device according to claim 1, wherein the active regions are configured to emit coherent or partially coherent primary radiation in an infrared spectral range.

3. The display device according to claim 1, wherein the secondary radiation comprises radiation in the first and second spectral ranges, wherein a filter element is arranged downstream of the radiation conversion element in a radiation direction, and wherein the filter element is configured to transmit radiation in the first spectral range for the first subpixel and radiation in the second spectral range for the second subpixel.

4. The display device according to claim 3, wherein the radiation conversion element has the same spectral radiation characteristic above the first subpixel and above the second subpixel.

5. The display device according to claim 1, wherein the radiation conversion element comprises a plurality of segments, wherein first segments are configured to emit secondary radiation in the first spectral range and second segments are configured to emit secondary radiation in the second spectral range.

6. The display device according to claim 1, wherein the radiation conversion element is configured to radiate the secondary radiation into a projected spatial angle of at most $\pi/5$.

7. The display device according to claim 1, further comprising a first optical element arranged between the active regions and the radiation conversion element.

8. The display device according to claim 1, further comprising a second optical element, wherein the radiation conversion element is arranged in a beam path between the active regions and the second optical element.

9. The display device according to claim 8, wherein the second optical element is a diffractive optical element.

10. The display device according to claim 1, wherein at least two of the active regions are integrated in a semiconductor chip of the semiconductor component.

11. The display device according to claim 1, wherein the semiconductor component comprises a plurality of surface emitting semiconductor regions, each semiconductor region forming an active region.

12. The display device according to claim 1, wherein an additional redundant active region is assigned to at least one subpixel.

13. The display device according to claim 1,
   wherein each active region is configured to emit coherent or partially coherent primary radiation in an infrared spectral range, and
   wherein the radiation conversion element is configured to emit the secondary radiation based on a non-linear optical process.

14. A display device comprising:
   at least one optoelectronic semiconductor component configured to generate primary radiation;
   a plurality of pixels, each pixel comprising:
      at least a first subpixel configured to generate radiation in a first spectral range; and
      a second subpixel configured to generate radiation in a second spectral range different from the first spectral range;
      at least two additional subpixels,
      wherein the first and second subpixels are each assigned an active region of the semiconductor component,
      wherein the subpixels are configured to radiate the radiation along a first radiation direction and the additional subpixels are configured to radiate the radiation along a second radiation direction extending obliquely to the first radiation direction;
   a radiation conversion element arranged downstream of at least some of the active regions, wherein the radiation conversion element is configured to:
      at least partially convert the primary radiation into secondary radiation; and
      radiate the secondary radiation into a projected spatial angle of at most $\pi/5$.

15. A display device comprising:
   at least one optoelectronic semiconductor component configured to generate primary radiation;
   a plurality of pixels, each pixel comprising:
      at least a first subpixel configured to generate radiation in a first spectral range; and
      a second subpixel configured to generate radiation in a second spectral range different from the first spectral range,
      wherein the first and second subpixels are each assigned an active region of the semiconductor component;
   a radiation conversion element arranged downstream of at least some of the active regions,
   the radiation conversion element configured to:
      at least partially convert the primary radiation into secondary radiation; and
      radiate the secondary radiation at a narrow angle, and
   wherein each pixel comprises at least two additional subpixels; and
   a second optical element,
   wherein the radiation conversion element is arranged in a beam path between the active regions and the second optical element, and
   wherein the second optical element is configured to direct radiation of the first and second subpixels in a first radiation direction and radiation of the additional subpixels in a second radiation direction extending obliquely to the first radiation direction.

16. The display device according to claim 15, wherein the second optical element is a diffractive optical element.

17. The display device according to claim 15, further comprising a first optical element arranged between the active regions and the radiation conversion element.

18. The display device according to claim 15, wherein the radiation conversion element is configured to radiate the secondary radiation into a projected spatial angle of at most $\pi/5$.

19. The display device according to claim 15, wherein an additional redundant active region is assigned to at least one subpixel.

20. The display device according to claim 15,
wherein each active region is configured to emit coherent or partially coherent primary radiation in an infrared spectral range, and
wherein the radiation conversion element is configured to emit the secondary radiation based on a non-linear optical process.

\* \* \* \* \*